United States Patent
Liaw

(10) Patent No.: US 12,356,601 B2
(45) Date of Patent: Jul. 8, 2025

(54) MEMORY CELL DESIGN

(71) Applicant: Taiwan Semiconductor Manufacturing Company, Ltd., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 549 days.

(21) Appl. No.: 17/711,791

(22) Filed: Apr. 1, 2022

(65) Prior Publication Data

US 2023/0262951 A1    Aug. 17, 2023

Related U.S. Application Data

(60) Provisional application No. 63/310,802, filed on Feb. 16, 2022.

(51) Int. Cl.
| | |
|---|---|
| *G11C 5/06* | (2006.01) |
| *H10B 10/00* | (2023.01) |
| *H10D 30/67* | (2025.01) |
| *H10D 62/10* | (2025.01) |
| *G11C 11/412* | (2006.01) |
| *H10D 89/10* | (2025.01) |

(52) U.S. Cl.
CPC ........... *H10B 10/125* (2023.02); *G11C 5/063* (2013.01); *H10D 30/6735* (2025.01); *H10D 30/6757* (2025.01); *H10D 62/118* (2025.01); *G11C 11/412* (2013.01); *H10D 89/10* (2025.01)

(58) Field of Classification Search
None
See application file for complete search history.

(56) References Cited

U.S. PATENT DOCUMENTS

| | | | |
|---|---|---|---|
| 8,625,334 B2 | 1/2014 | Liaw | |
| 8,879,305 B2 | 11/2014 | Liaw | |
| 10,825,835 B1* | 11/2020 | Liaw | ...................... H01L 29/267 |
| 11,024,632 B2 | 6/2021 | Liaw | |
| 2014/0239255 A1* | 8/2014 | Kang | ................. H01L 29/42392 |
| | | | 257/24 |
| 2020/0035688 A1* | 1/2020 | Liaw | ...................... G11C 11/412 |

(Continued)

FOREIGN PATENT DOCUMENTS

CN          113764420 A      12/2021

*Primary Examiner* — Nicholas J Tobergte
*Assistant Examiner* — William Henry Anderson
(74) *Attorney, Agent, or Firm* — HAYNES AND BOONE, LLP

(57) ABSTRACT

Memory devices are provided. A memory device according to the present disclosure includes a first pull-down device (PD-1), a second pull-down device (PD-2), a first pass-gate device (PG-1), and a second pass-gate device (PG-2) disposed in a first p-well on a substrate, and a first pull-up device (PU-1), a second pull-up device (PU-2), a first isolation device (IS-1), and a second isolation device (IS-2) disposed in an n-well adjacent the first p-well. The PD-1, the PD-2, the PG-1, and the PG-2 share a first active region. The PU-1, the PU-2, the IS-1, and the IS-2 share a second active region. A first gate of the IS-1 and a second gate of the IS-2 are coupled to a positive supply voltage. A drain of the PU-1 and a drain of the PU-2 are coupled to the positive supply voltage (CVdd).

20 Claims, 12 Drawing Sheets

(56) References Cited

U.S. PATENT DOCUMENTS

| | | |
|---|---|---|
| 2020/0243544 A1 | 7/2020 | Shih |
| 2021/0057421 A1* | 2/2021 | Liaw .................. H10B 10/12 |
| 2021/0098466 A1* | 4/2021 | Liaw .................. H10B 10/12 |
| 2021/0134837 A1* | 5/2021 | You .................. H10D 84/907 |

* cited by examiner

MEMORY CELL DESIGN

PRIORITY DATA

This application claims priority to U.S. Provisional Patent Application No. 63/310,802 filed on Feb. 16, 2022, entitled "MEMORY CELL DESIGN", the entire disclosure of which is hereby incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, these advances have also increased the complexity of processing and manufacturing semiconductor devices.

In deep sub-micron integrated circuit technology, an embedded static random access memory (SRAM) device has become a popular storage unit of high speed communication, image processing and system-on-chip (SOC) products. Some existing SRAM cell designs require patterning of active regions into segments having different lengths, which is likely to result in leakage. Therefore, although existing SRAM cells are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
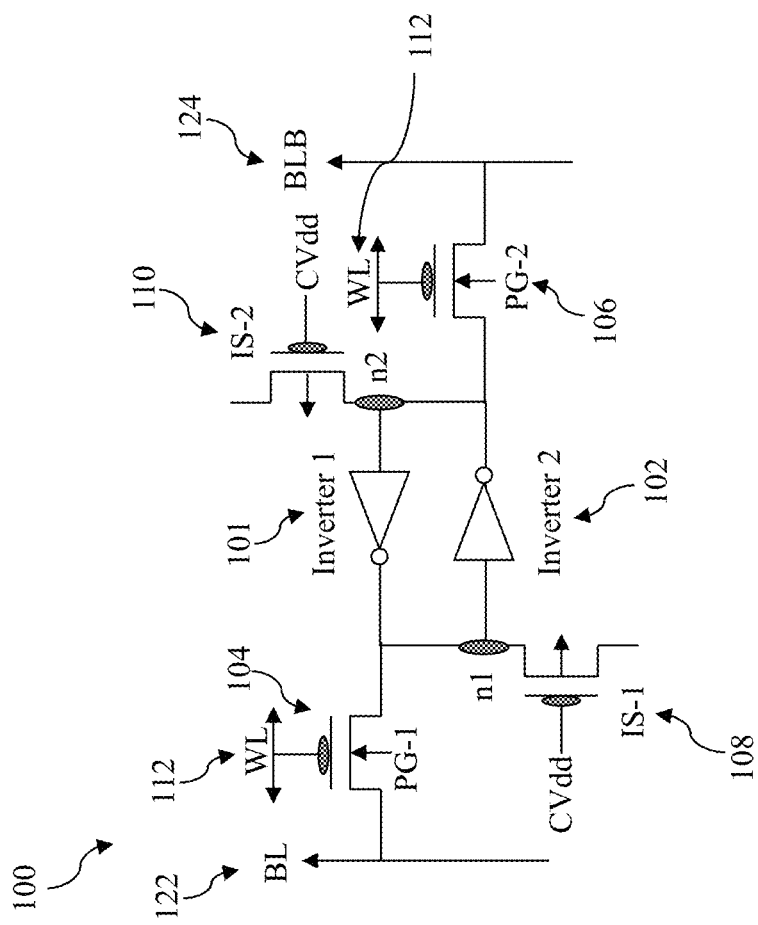
FIG. 1 is a schematic circuit diagram of a static random access memory (SRAM) cell, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Static Random Access Memory (SRAM) is commonly used in integrated circuits as it is featured with the ability to hold data without the need to refresh. In IC design, a plurality of devices may be grouped together as an SRAM cell, which serves as a basic building block of a memory array or memory device. To meet the constant need of scaling down, efforts are invested to bring down the size of an SRAM cell. This scaling down process is not without challenges. For example, to allow shared gate structures and shared source/drain contacts to reduce cell dimensions, discontinuous active regions and densely packed metal lines may be implemented. Discontinuous active regions refer to active regions that are segmented by patterning and end capped by dielectric features and may involve additional processes, costs, or leakage paths. Additionally, densely packed metal lines in metal layers near the front-end-of-line (FEOL) structures may result in narrow metal lines that may contribute to resistive-capacitive delay (RC delay).

The present disclosure provides a single-port (SP) SRAM cell that include continuous active regions and routing structures that allow more spaced-out metal lines to reduce RC delay. The SP SRAM cell includes eight (8) devices—a first pull-up transistor (PU-1), a second pull-up transistor (PU-2), a first isolation device (IS-1), a second isolation device (IS-2), a first pass-gate transistor (PG-1), a second pass-gate transistor (PG-2), a first pull-down transistor (PD-1), and a second full down pull-down transistor (PD-2). The gate nodes of IS-1 and IS-2 are electrically coupled to the positive supply voltage (CVdd). The drain nodes of IS-1 and IS-2 are electrically coupled an adjacent pull-up transistor. A cell height of the SRAM cell of the present disclosure is about 4 times of a gate pitch, which includes a gate length and a gate spacing. The SRAM cell of the present disclosure allows greater widths and spacings of bit lines, which may lead to reduction of resistance and capacitance.

Figure 2:
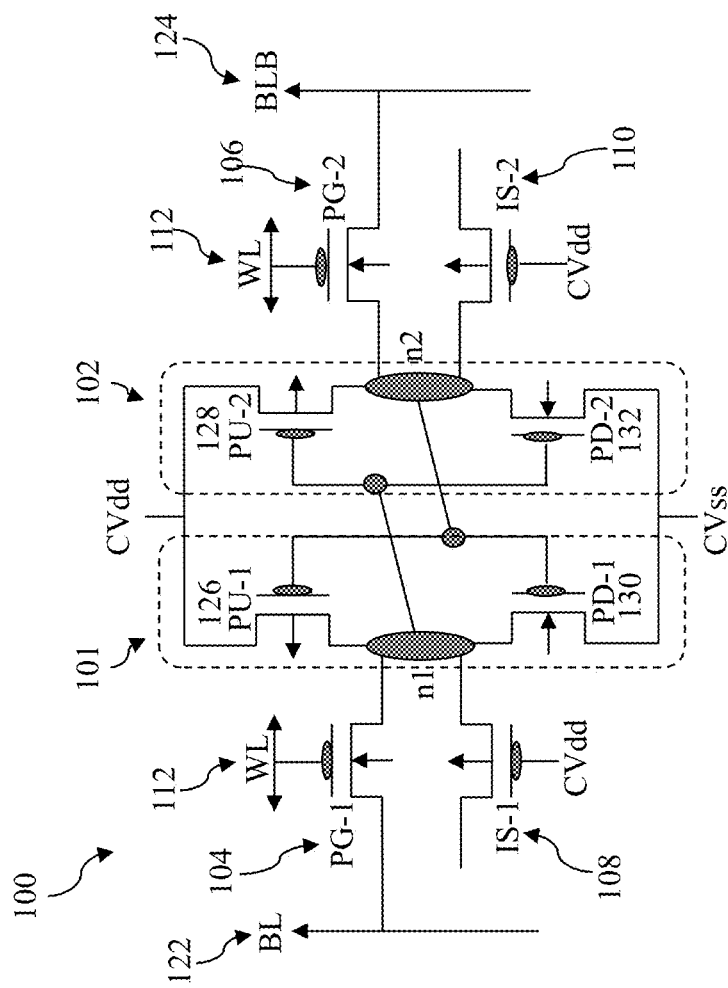
FIG. 2 is an alternative schematic circuit diagram of the SRAM cell in FIG. 1, according to various aspects of the present disclosure.

FIGS. 1 and 2 are schematic circuit diagrams of a single-port static random access memory (SP SRAM) cell 100. The SP SRAM cell 100 may be implemented using planar field effect transistors (FETs) or multi-gate FETs. A planar FET includes a gate structure that may induce a planar channel region along one surface of its active region, hence its name. A multi-gate FET includes a gate structure that is in contact with at least two surfaces of its active region. Examples of multi-gate FETs include fin-type FETs (FinFETs) and multi-bridge channel (MBC) FETs. A FinFET includes a fin-shaped active region arising from a substrate and a gate structure disposed over a top surface and sidewalls of the fin-shaped active region. An MBC FET includes at least one channel member extending between two source/drain features and a gate structure that wraps completely around the at least one channel member. Because its gate structure wraps around the channel member, an MBC FET may also be referred to as a gate-all-around (GAA) FET or a surrounding gate transistor (SGT). Depending on the shapes and orientation, a channel member in a MBC FET may be referred to as a nanosheet, a semiconductor wire, a nanowire, a nanostructure, a nano-post, a nano-beam, or a nano-bridge. In some instances, an MBC FET may be referred to by the shape of the channel member. For example, an MBC FET having one or more nanosheet channel member may also be referred to as a nanosheet transistor or a nanosheet FET.

FIG. 1 illustrates a schematic circuit diagram of an SP SRAM cell 100. The SP SRAM cell 100 includes a pair of cross-coupled inverters—Inverter 1 (Inverter 101) and Inverter 2 (Inverter 102), a first pass-gate transistor (PG-1) 104, a second pass-gate transistor (PG-2) 106, a first isolation transistor (IS-1) 108, a second isolation transistor (IS-2) 110. The inverters—Inverter 101 and Inverter 102 are cross-coupled between nodes n1 and n2, and form a latch circuit. In some embodiments, one of the nodes n1 and n2 is used as an output terminal of the latch circuit and the other node is used as an input terminal of the latch circuit. The first pass-gate transistor (PG-1) 104 is coupled between a bit line BL 122 and the node n1, and the second pass-gate transistor (PG-2) 106 is coupled between a complementary bit line BLB 124 and the node n2, where the complementary bit line BLB is complementary to the bit line BL. The gates of the pass-gate transistors (PG-1) 104 and (PG-2) 106 are coupled to the same word-line WL 112. Furthermore, the pass-gate transistors (PG-1) 104 and (PG-2) 106 are NMOS transistors. The gates of the first and second isolation transistors (IS-1) 108 and (IS-2) 110 are coupled to the positive supply voltage (CVdd) and the sources of the isolation transistors (IS-1) 108 and (IS-2) 110 are floating. Additionally, the drain of the first isolation transistor (IS-1) 108 is electrically coupled to node n1 and the drain of the second isolation transistor (IS-2) 110 is electrically coupled to node 2. In some embodiments, the first and second isolation transistors (IS-1) 108 and (IS-2) 110 are PMOS transistors.

FIG. 2 shows a simplified diagram of the SP SRAM cell 100 of FIG. 1, in accordance with some embodiments of the disclosure. The inverter 101 includes a first pull-up transistor (PU-1) 126 and a first pull-down transistor (PD-1) 130. The first pull-up transistor (PU-1) 126 is a PMOS transistor, and the first pull-down transistor (PD-1) 130 is an NMOS transistor. The drain of the first pull-up transistor (PU-1) 126 and the drain of the first pull-down transistor (PD-1) 130 are coupled to the node n1 connecting to the first pass-gate transistor (PG-1) 104. The gates of the first pull-up transistor (PU-1) 126 and the first pull-down transistor (PD-1) 130 are coupled to the node n2 connecting to the second pass-gate transistor (PG-2) 106. Furthermore, the source of the first pull-up transistor (PU-1) 126 is coupled to the positive supply voltage CVdd, and the source of the first pull-down transistor (PD-1) 130 is coupled to a ground voltage CVss.

Similarly, the inverter 102 includes a second pull-up transistor (PU-2) 128 and a second pull-down transistor (PD-2) 132. The second pull-up transistor (PU-2) 128 is a PMOS transistor, and the second pull-down transistor (PD-2) 132 is an NMOS transistor. The drains of the second pull-up transistor (PU-2) 128 and the second pull-down transistor (PD-2) 132 are coupled to the node n2 connecting to the second pass-gate transistor (PG-2) 106. The gates of the second pull-up transistor (PU-2) 128 and the second pull-down transistor (PD-2) 132 are coupled to the node n1 connecting to the first pass-gate transistor (PG-1) 104. Furthermore, the source of the second pull-up transistor (PU-2) 128 is coupled to the positive supply voltage CVdd, and the source of the second pull-down transistor (PD-2) 132 is coupled to the ground voltage CVss. As shown in FIG. 2, the SP SRAM cell 100 may include a total of 8 transistors and may therefore also be referred to as an 8T SRAM cell 100.

It is noted that in the SP SRAM cell 100 in FIG. 2, the source of the first pull-up transistor (PU-1) 126, the source of the second pull-up transistor (PU-2) 128, and the gates of the first and second isolation transistors (IS-1) 108 and (IS-2) 110 are all coupled to the positive supply voltage (CVdd).

Figure 3:
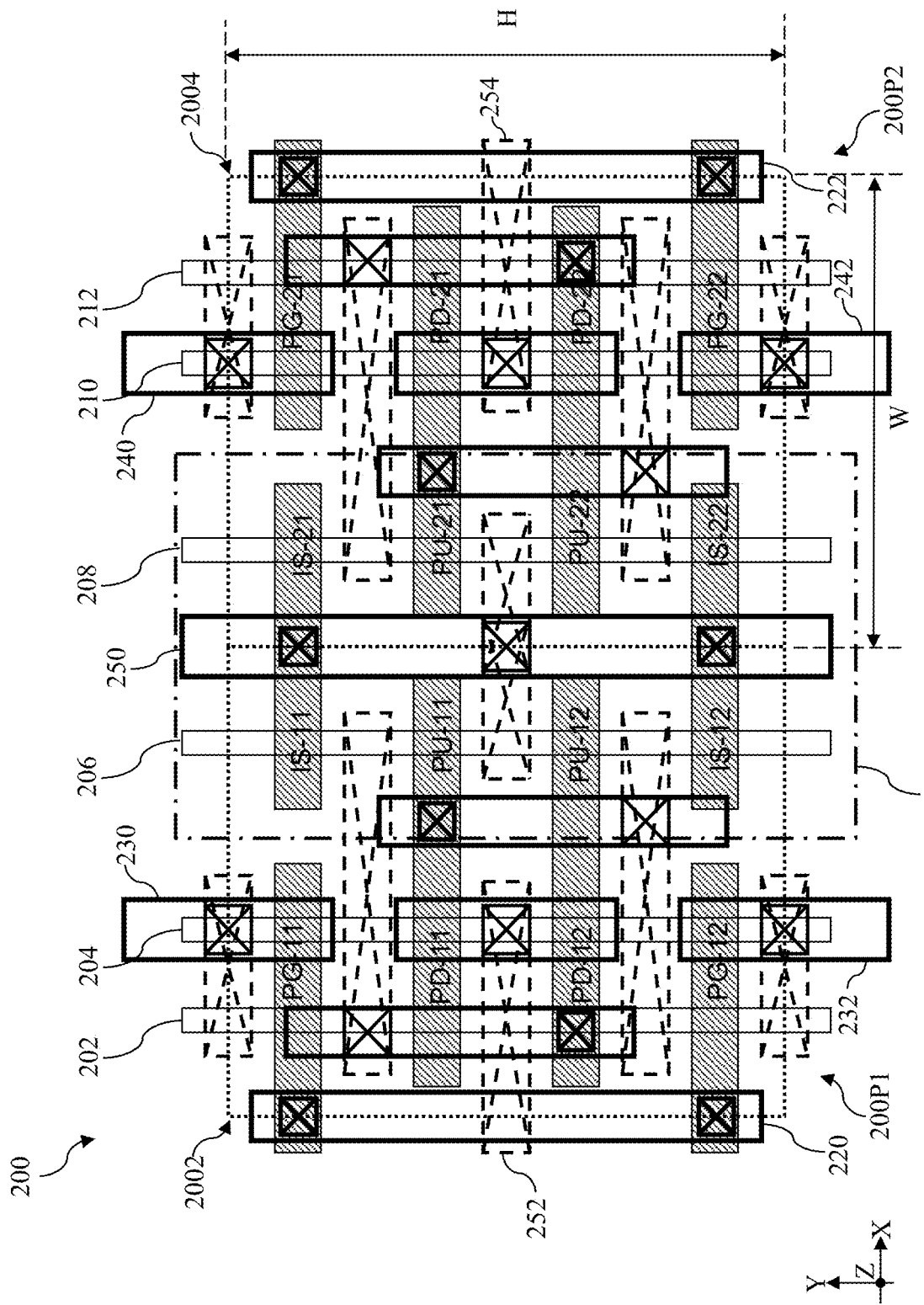
FIG. 3 is a schematic layout of the SRAM cell in FIG. 2, according to various aspects of the present disclosure.
Figure 4:
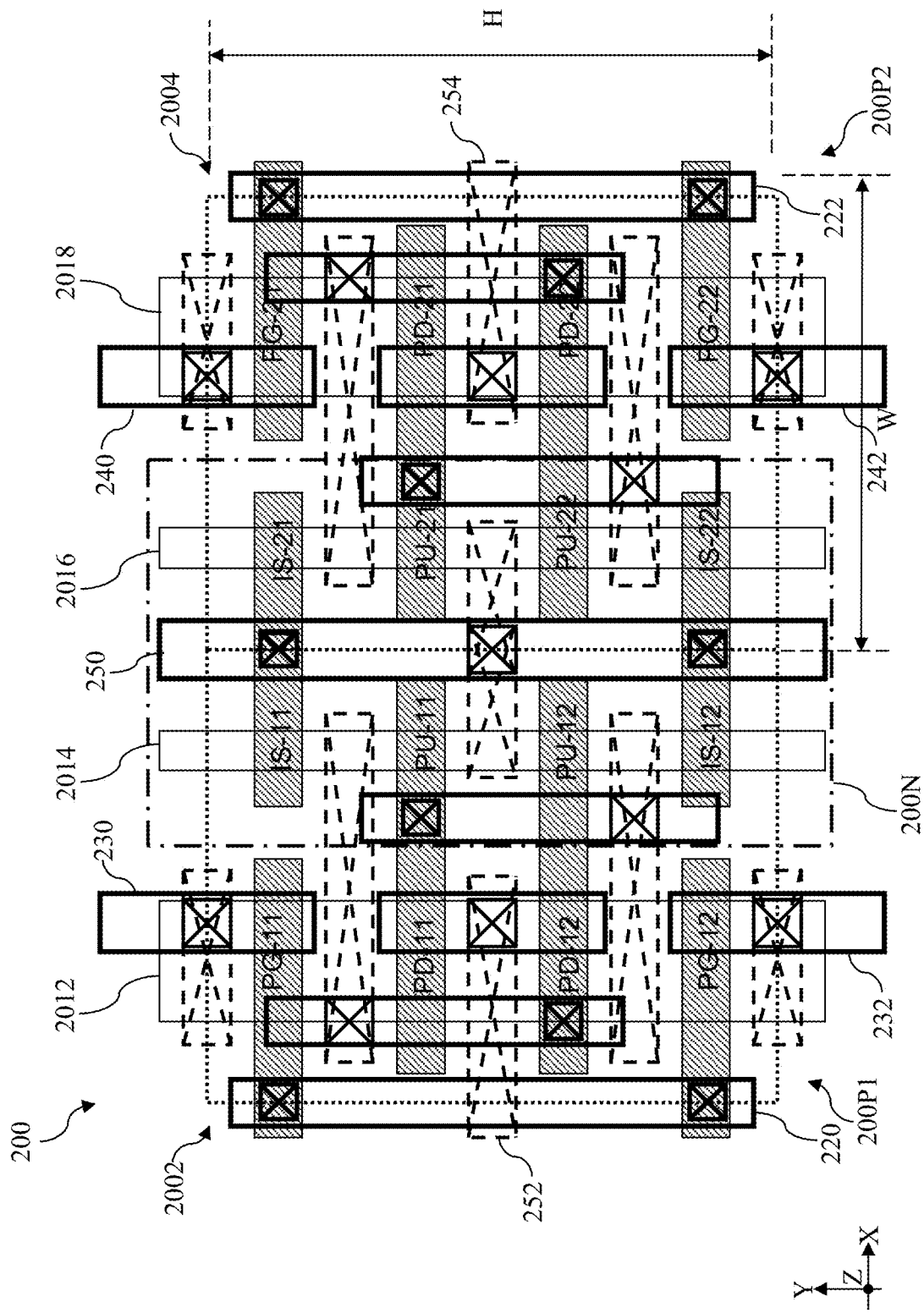
FIG. 4 is an alternative schematic layout of the SRAM cell in FIG. 2, according to various aspects of the present disclosure.

The SP SRAM cell 100 in FIG. 2 may be implemented using multi-gate transistors, such as FinFETs or MBC FETs. FIG. 3 illustrates a schematic layout to implement the SP SRAM cell 100 in FIG. 2 using FinFETs while FIG. 4 illustrates a schematic layout to implement the SP SRAM cell 100 in FIG. 2 using MBC FETs.

Reference is first made to FIG. 3. FIG. 3 illustrates a layout of a dual cell 200 that includes a first cell 200₂ and a second cell 200₄ that are joined along a center line extending along the Y direction. It is noted that the illustration of the dual cell 200 is for the purposes of demonstrating the highly symmetric nature of the SRAM cells of the present disclosure and how two adjacent SRAM cells share the same N-type well region 200N. Each of the first cell 2002 and the second cell 2004 is an implementation of the SP SRAM cell 100 in FIG. 2. That is, each of the first cell 2002 and the second cell 2004 is an 8T SRAM cell with eight (8) transistors, including two pass-gate transistors, two pull-up transistors, two pull-down transistors, and two isolation transistors. Each of the first cell 2002 and the second cell 2004 includes a cell height H along the Y direction and a cell width W along the X direction. In the depicted embodiment, the cell height H spans over a total of 4 gate structures and is measured at about 4 gate pitches. Each of the gate pitches include a gate length along the Y direction and a gate spacing between two adjacent gate structures along the Y direction.

Referring to the first cell 2002 shown in the left-hand-side of FIG. 3. The first cell 2002 includes a first pass-gate transistor (PG-11), a second pass-gate transistor (PG-12), a first pull-down transistor (PD-1), and a second pull-down transistor (PD-12) disposed in a first p-type well 200P1, and a first isolation transistor (IS-11), a second isolation transistor (IS-12), a first pull-up transistor (PU-1), and a second pull-up transistor (PU-2) disposed in the n-type well. In some embodiments, the first p-type well may be doped with a p-type dopant such as boron (B) or boron difluoride ($BF_2$) and the n-type well may be doped with an n-type dopant such as phosphorus (P) or arsenic (As). As shown in FIG. 3, the first pass-gate transistor (PG-11), the second pass-gate transistor (PG-12), the first pull-down transistor (PD-11), and the second pull-down transistor (PD-12) may be formed over a first fin 202 and a second fin 204, which may also be regarded as a double-fin active region. The first fin 202 and the second fin 204 extend lengthwise along the Y direction. The first isolation transistor (IS-11), the second isolation transistor (IS-12), the first pull-up transistor (PU-11), and the second pull-up transistor (PU-12) may be formed over a third fin 206 also extending lengthwise along the Y direction. Different from the first pass-gate transistor (PG-11), the second pass-gate transistor (PG-12), the first pull-down transistor (PD-11), and the second pull-down transistor (PD-12) that are dual-fin transistors, the first isolation transistor (IS-11), the second isolation transistor (IS-12), the first pull-up transistor (PU-11), and the second pull-up transistor (PU-12) are mono-fin transistors.

Referring still to FIG. 3, the gate structures of the first pass-gate transistor (PG-11), the second pass-gate transistor (PG-12), the first pull-down transistor (PD-11), the second pull-down transistor (PD-12), the first isolation transistor (IS-11), the second isolation transistor (IS-12), the first pull-up transistor (PU-11), and the second pull-up transistor (PU-12) extend lengthwise along the X direction that is perpendicular to the Y direction. As shown in FIG. 3, the gate structures of the first pass-gate transistor (PG-11) and the first isolation transistor (IS-11) are isolated from one another but are aligned along the X direction. In some implementations, the gate structures of the first pass-gate transistor (PG-11) and the first isolation transistor (IS-11) may be formed from a single gate structure by dividing these gate structures with a dielectric feature. The first pull-down transistor (PD-11) and the first pull-up transistor (PU-11) share the same gate structure. The second pull-down transistor (PD-12) and the second pull-up transistor (PU-12) share the same gate structure. The gate structures of the second pass-gate transistor (PG-12) and the second isolation transistor (IS-12) are isolated from one another but are aligned along the X direction. In some implementations, the gate structures of the second pass-gate transistor (PG-12) and the second isolation transistor (IS-12) may be formed from a single gate structure by dividing these gate structures with a dielectric feature.

Referring still to FIG. 3, the drain of the first pull-down transistor (PD-11) and the drain of the first pull-up transistor (PU-11) share the same source/drain contact that spans over the first fin 202, the second fin 204 and the third fin 206. This shared source/drain contact is electrically coupled to the shared gate structure of the second pull-down transistor (PD-12) and the second pull-up transistor (PU-12) by a local contact line extending along the Y direction. The drain of the second pull-down transistor (PD-12) and the drain of the second pull-up transistor (PU-12) share the same source/drain contact that spans over the first fin 202, the second fin 204 and the third fin 206. This shared source/drain contact is electrically coupled to the shared gate structure of the first pull-down transistor (PD-11) and the first pull-up transistor (PU-11) by another local contact line extending along the Y direction.

Similarly, the second cell 2004 includes a third pass-gate transistor (PG-21), a fourth pass-gate transistor (PG-22), a third pull-down transistor (PD-21), and a fourth pull-down transistor (PD-22) disposed in a second p-type well 200P2, and a third isolation transistor (IS-21), a fourth isolation transistor (IS-22), a third pull-up transistor (PU-21), and a fourth pull-up transistor (PU-22) disposed in the n-type well. The first p-type well 200P1 and the second p-type well 200P2 may be two portions of a continuous p-type well and the n-type well is disposed within the continuous p-type well. In some embodiments, the second p-type well 200P2 may be doped with a p-type dopant such as boron (B) or boron difluoride ($BF_2$) like the first p-type well 200P1. As shown in FIG. 3, the third pass-gate transistor (PG-21), the fourth pass-gate transistor (PG-22), the third pull-down transistor (PD-21), and the fourth pull-down transistor (PD-22) may be formed over a fifth fin 210 and a sixth fin 212, which may also be referred as a double-fin active region. The fifth fin 210 and the sixth fin 212 extend lengthwise along the Y direction. The third isolation transistor (IS-21), the fourth isolation transistor (IS-22), the third pull-up transistor (PU-21), and the fourth pull-up transistor (PU-22) may be formed over a fourth fin 208 also extending lengthwise along the Y direction. Different from the third pass-gate transistor (PG-21), the fourth pass-gate transistor (PG-22), the third pull-down transistor (PD-21), and the fourth pull-down transistor (PD-22) that are dual-fin transistors, the third isolation transistor (IS-21), the fourth isolation transistor (IS-12), the third pull-up transistor (PU-21), and the fourth pull-up transistor (PU-22) are mono-fin transistors.

Referring to FIG. 3, the gate structures of the third pass-gate transistor (PG-21), the fourth pass-gate transistor (PG-22), the third pull-down transistor (PD-21), the fourth pull-down transistor (PD-22), the third isolation transistor (IS-21), the fourth isolation transistor (IS-22), the third pull-up transistor (PU-21), and the fourth pull-up transistor (PU-22) extend lengthwise along the X direction, perpendicular to the Y direction. As shown in FIG. 3, the gate structures of the third pass-gate transistor (PG-21) and the third isolation transistor (IS-21) are isolated from one another but are aligned along the X direction. In some implementations, the gate structures of the third pass-gate transistor (PG-21) and the third isolation transistor (IS-21) may be formed from a single gate structure by dividing these gate structures with a dielectric feature. The third pull-down transistor (PD-21) and the third pull-up transistor (PU-21) share the same gate structure. The fourth pull-down transistor (PD-22) and the fourth pull-up transistor (PU-22) share the same gate structure. The gate structures of the fourth pass-gate transistor (PG-22) and the fourth isolation transistor (IS-22) are isolated from one another but are aligned along the X direction. In some implementations, the gate structures of the fourth pass-gate transistor (PG-22) and the fourth isolation transistor (IS-22) may be formed from a single gate structure by dividing these gate structures with a dielectric feature.

Referring still to FIG. 3, the drain of the third pull-down transistor (PD-21) and the drain of the third pull-up transistor (PU-21) share the same source/drain contact that spans over the fourth fin 208, the fifth fin 210 and the sixth fin 212. This shared source/drain contact is electrically coupled to the shared gate structure of the fourth pull-down transistor (PD-22) and the fourth pull-up transistor (PU-22) by a local contact line extending along the Y direction. The drain of the fourth pull-down transistor (PD-22) and the drain of the fourth pull-up transistor (PU-22) share the same source/drain contact that spans over the fourth fin 208, the fifth fin 210 and the sixth fin 212. This shared source/drain contact is electrically coupled to the shared gate structure of the third pull-down transistor (PD-21) and the third pull-up transistor (PU-21) by another local contact line extending along the Y direction.

Reference is still made to FIG. 3. In the dual cell 200, the first isolation transistor (IS-11) in the first cell 2002 and the third isolation transistor (IS-21) in the second cell 2004 share the same gate structure that is electrically coupled to a metal line 250 disposed over the interface of the first cell 2002 and the second cell 2004. The metal line 250 is electrically coupled to the positive supply voltage (CVdd) and may also be referred to as a power rail 250. Similarly, the second isolation transistor (IS-12) in the first cell 2002 and the fourth isolation transistor (IS-22) in the second cell 2004 share the same gate structure that is electrically coupled to the metal line 250 disposed over the interface of the first cell 2002 and the second cell 2004. The same metal line 250 is electrically coupled to a shared source contact for the first pull-up transistor (PU-11), the second pull-up transistor (PU-12), the third pull-up transistor (PU-21), and the fourth pull-up transistor (PU-22). That is, the sources of the first pull-up transistor (PU-11), the second pull-up transistor (PU-12), the third pull-up transistor (PU-21), and the fourth pull-up transistor (PU-22) are also coupled to the positive supply voltage (CVdd).

The gates of the first pass-gate transistor (PG-11) and the second pass-gate transistor (PG-12) are electrically coupled together with a first landing pad 220, which is to couple to a first word line extending along the X direction. The gates of the third pass-gate transistor (PG-21) and the fourth pass-gate transistor (PG-22) are electrically coupled together with a second landing pad 222, which is to couple to a second word line extending along the X direction. In the first cell 2002, the first pull-down transistor (PD-11) and the second pull-down transistor (PD-12) share the same source contact, which is coupled to a contact pad 252 for connection to the ground voltage (CVss). In the second cell 2004, the third pull-down transistor (PD-21) and the fourth pull-down transistor (PD-22) share the same source contact, which is coupled to another contact pad 254 for connection to the ground voltage (CVss). In the first cell 2002, the source of the first pass-gate transistor (PG-11) is coupled to a BL landing pad 230 and the source of the second pass-gate transistor (PG-12) is coupled to a BLB landing pad 232. In the second cell 2004, the source of the third pass-gate transistor (PG-21) is coupled to a BL landing pad 240 and the source of the fourth pass-gate transistor (PG-22) is coupled to a BLB landing pad 242.

As shown in FIG. 3, all of the first fin 202, the second fin 204, the third fin 206, the fourth fin 208, the fifth fin 210, and the sixth fin 212 have the same width along the X direction and extend the same length along the Y direction within the boundary of the dual cell 200. None of the fins in the dual cell 200 is cut short or truncated to have a different length along the Y direction. All of the gate structures of the sixteen (16) transistors in the dual cell 200 have the same gate length along the Y direction, where the gate length is defined by the current flow direction. Additionally, the gate structures are disposed at a constant gate pitch along the Y direction. For avoidance of doubts, a gate pitch here refers to a sum of one gate length and one spacing between two adjacent gate structures. In terms of gate pitches, the dual cell 200 has a cell height H that is substantially equal to four (4) gate pitches. Each of the first cell 2002 and the second cell 2004 has the same cell height H as well. Along the X direction, each of the first cell 2002 and the second cell 2004 has a cell width W. The dual cell 200 therefore has a width equal to two times of the cell width W (2 W).

The first landing pad 220, the second landing pad 222, the BL landing pad 230, the BLB landing pad 232, the BL landing pad 240, the BLB landing pad 242, the power rail 250 are disposed in a first metal layer (M1) immediately over the middle-of-the-line (MEOL) structures, which are disposed over the front-end-of-line (FEOL) structures. As used herein the FEOL structures may include source/drain features and gate structures and the MEOL structures may include source/drain contacts, source/drain contact vias over the source/drain contacts, and gate vias. The local interconnects, such as the local contact lines connecting the shared drain contacts, are also disposed in the first metal layer (M1).

The dual cell 200 in FIG. 3 may also be implemented using MBC transistors as shown in FIG. 4. The dual cell 200 in FIG. 4 includes a first nanostructure stack 2012, a second nanostructure stack 2014, a third nanostructure stack 2016, and a fourth nanostructure stack 2018. Each of these nanostructure stacks includes a vertical stack of nanostructures that extend lengthwise along the Y direction. When a thickness of each of the nanostructures in the nanostructure stacks is kept the same for the ease of fabrication, On-state current (Ion) of an MBC transistor may be modulated by varying a width of each of the nanostructures. As shown in FIG. 3, a dual-fin active region may be implemented in the first cell 2002 and the second cell 2004 when a greater Ion is desired. Instead of having two fin structures, the first nanostructure stack 2012 and the fourth nanostructure stack 2018 have a nanostructure width along the X direction greater than that in the second nanostructure stack 2014 and the third nanostructure stack 2016. In some instances, a nanostructure width in the first nanostructure stack 2012 (or the fourth nanostructure stack 2018) may be between about 1.2 times to about 5 times (such as between about 1.5 times and about 3 times) of that in the second nanostructure stack 2014 (or the third nanostructure stack 2016). With respect to each of the transistors in FIG. 4, the gate structure wraps around each of the nanostructures in the respective nanostructure stack, which is a characteristic feature of an MBC transistor. Except for the use of nanostructure stacks and how gate structures engage the active regions, the dual cell 200 in FIG. 4 is similar to the dual cell in FIG. 3. For that reasons, the description of the features for FIG. 3 largely applies to FIG. 4 and will not be repeated for brevity.

Figure 5:
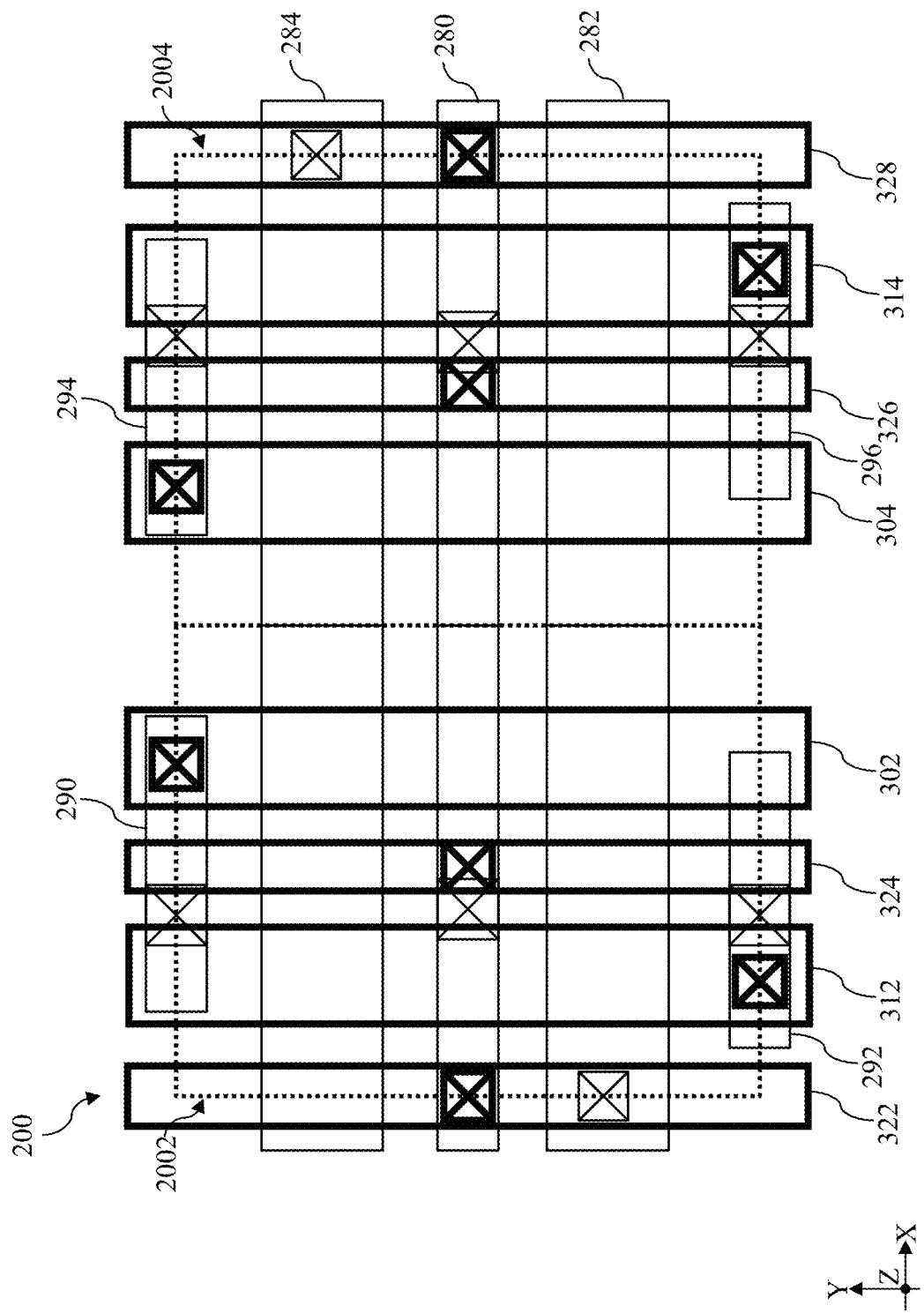
FIG. 5 is a first schematic layout of metal layers for the SRAM cell in FIG. 3 or 4, according to various aspects of the present disclosure.
Figure 6:
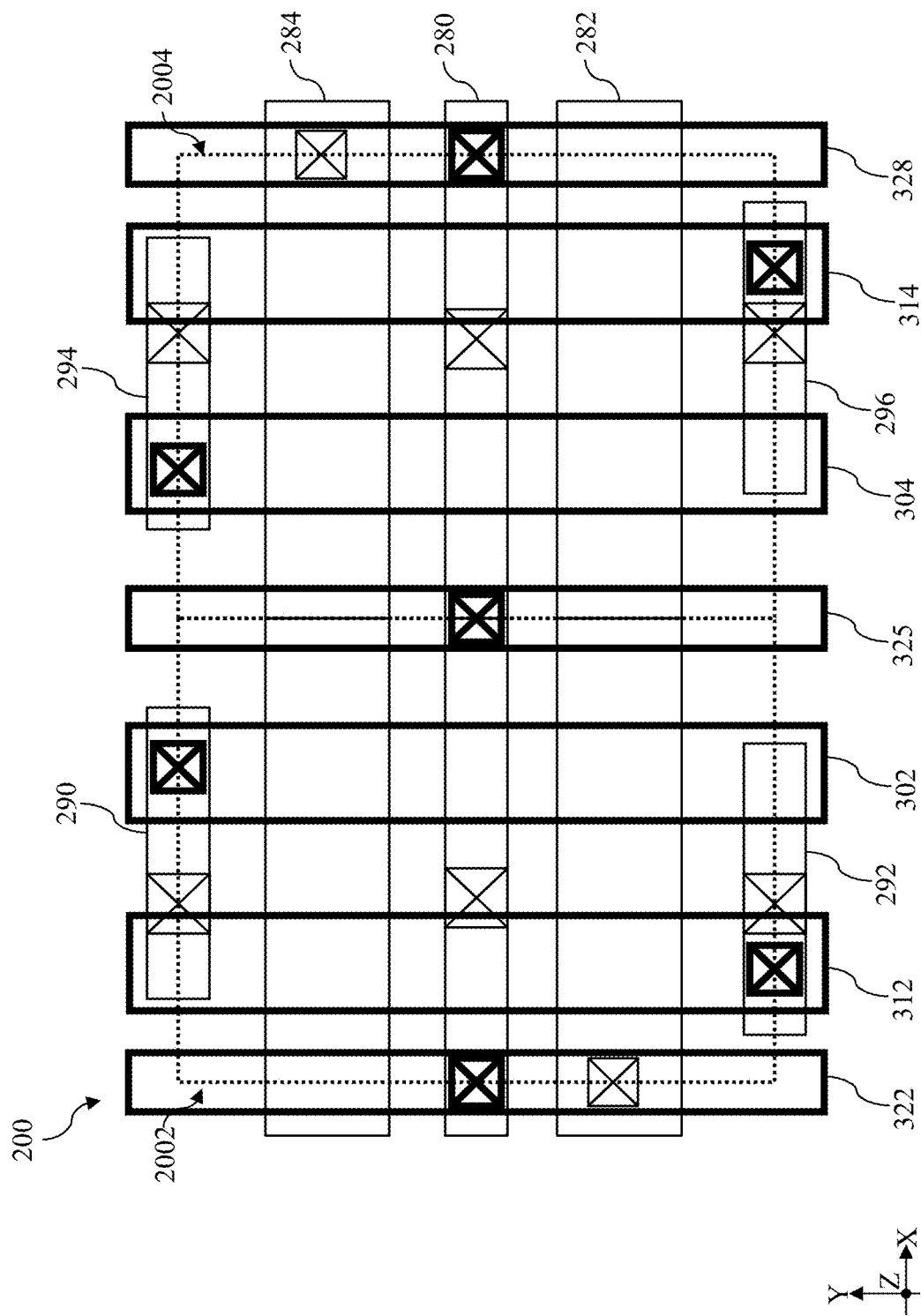
FIG. 6 is a second schematic layout of metal layers for the SRAM cell in FIG. 3 or 4, according to various aspects of the present disclosure.

FIGS. 5 and 6 illustrate two example metal layer structures to route signals in the dual cell 200 in FIG. 3 or 4. The example metal layer structures in FIGS. 5 and 6 are disposed over the structures shown in FIGS. 3 and 4 and may be disposed in a second metal layer (M2) over the first metal layer (M1) and a third metal layer (M3) over the second metal layer (M2). For clarity, the FEOL, MEOL, and the first metal layer (M1) structures shown in FIG. 3 or 4 are omitted from FIGS. 5 and 6. The vertical overlapping between the metal layers in FIGS. 5 and 6 and the schematic layout in FIG. 3 is further illustrated in FIGS. 7 and 8. The vertical overlapping between the metal layers in FIGS. 5 and 6 and the schematic layout in FIG. 4 is omitted as it is substantially similar to that is shown in FIGS. 7 and 8, except for the use of nanostructure stacks.

Figure 7:
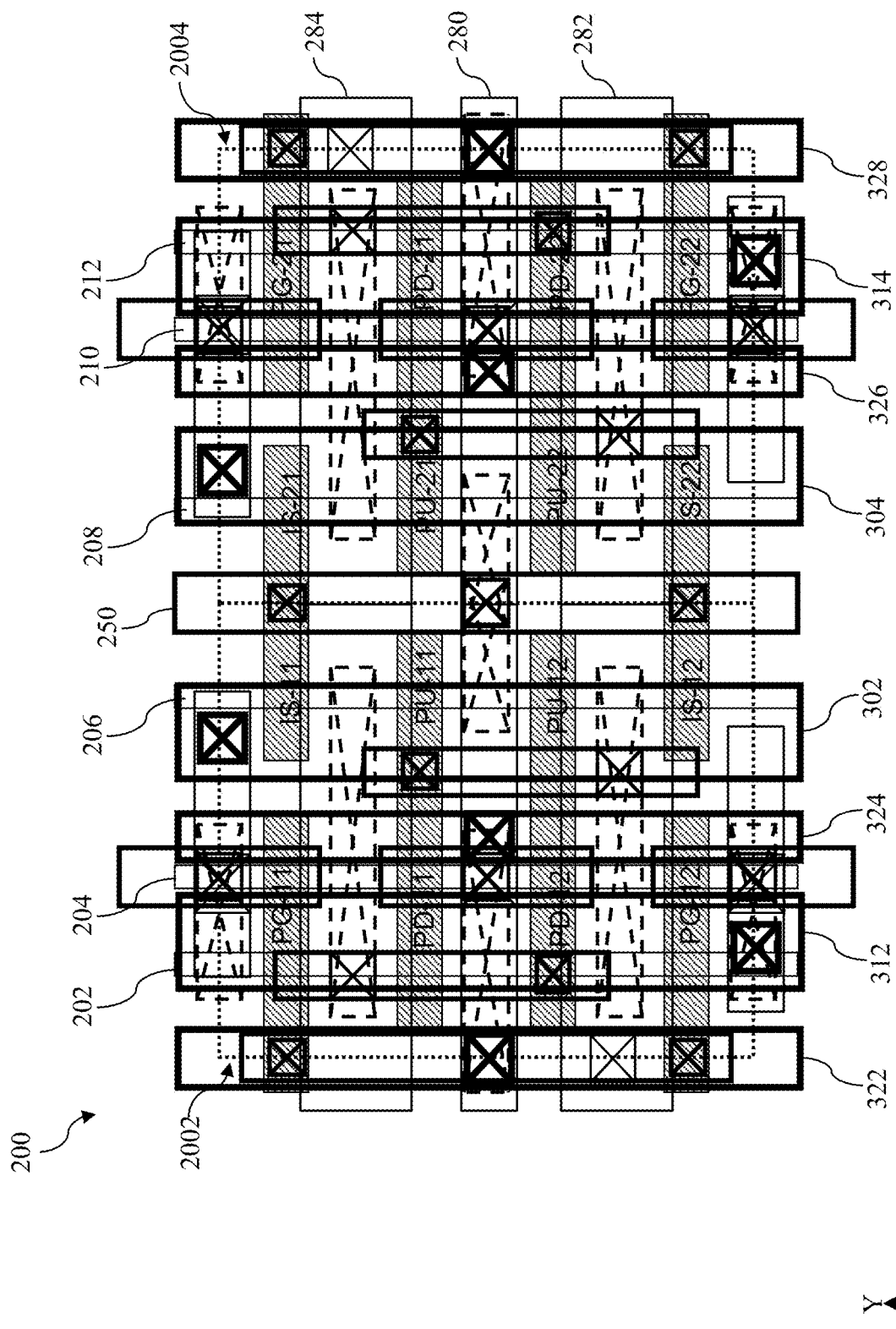
FIG. 7 is a schematic layout including the SRAM cell in FIG. 3 and the first schematic layout of metal layers in FIG. 5, according to various aspects of the present disclosure.
Figure 8:
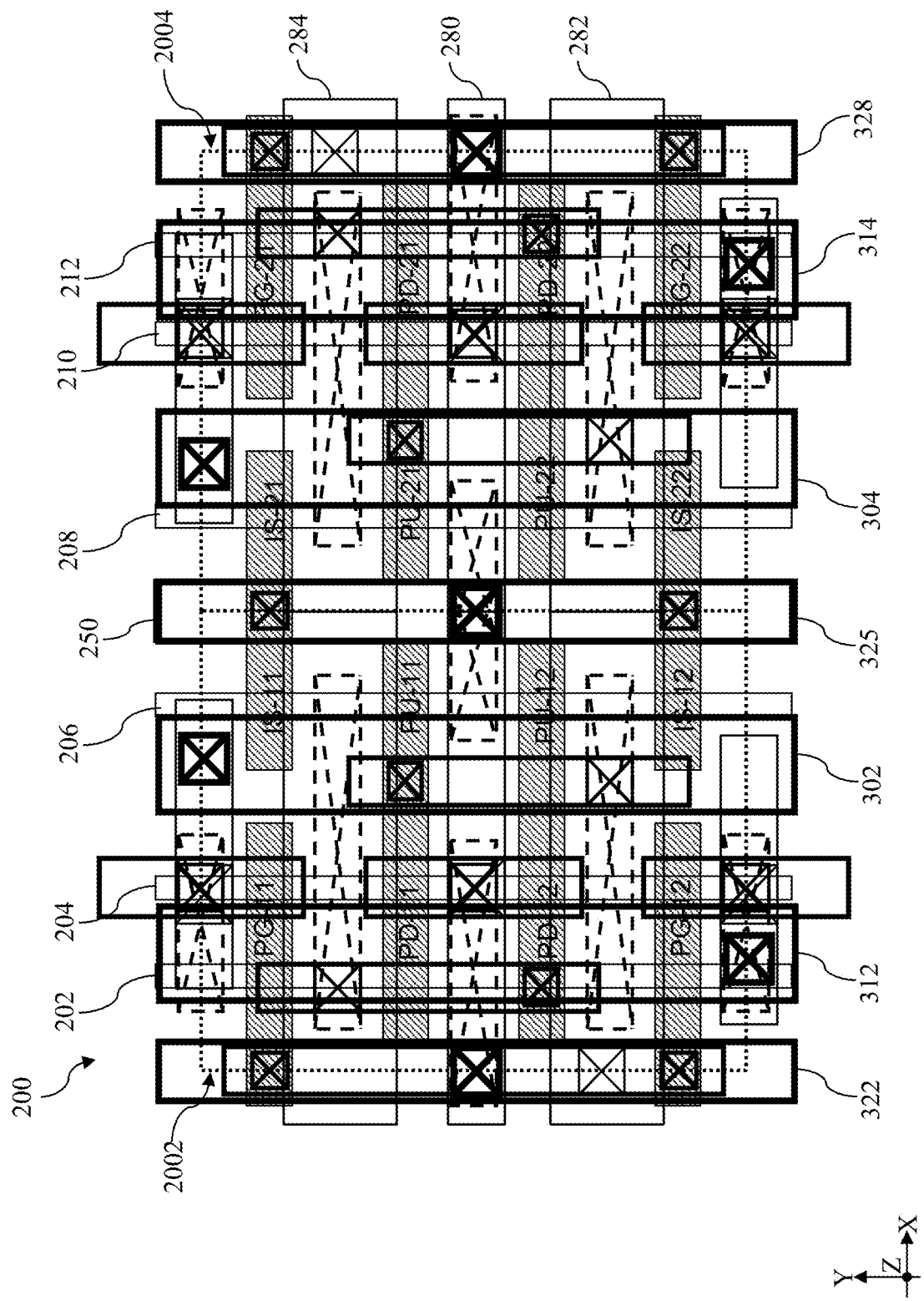
FIG. 8 is a schematic layout including the SRAM cell in FIG. 3 and the second schematic layout of metal layers in FIG. 6, according to various aspects of the present disclosure.

Reference is first made to FIGS. 5 and 7. The dual cell 200 may further include a first word line 282 that is coupled to the first landing pad 220 by a via and a second word line 284 that is coupled to the second landing pad 222 by a via. Both the first word line 282 and the second word line 284 extend lengthwise along the X direction. In this regard, the dual cell 200 and each of the first cell 2002 and the second cell 2004 are spanned over by two word lines, rather than just one word line. A ground rail 280 is disposed between the first word line 282 and the second word line 284 and also extends lengthwise along the X direction. The ground rail 280 is electrically coupled to the shared source contacts of the first pull-down transistor (PD-11), the second pull-down transistor (PD-12), the third pull-down transistor (PD-21) and the fourth pull-down transistor (PD-22). A first BL extension pad 290 is disposed over and electrically coupled to the BL landing pad 230 to reroute the BL signal. A first BLB extension pad 292 is disposed over and electrically coupled to the BLB landing pad 232 to reroute the BLB signal. A second BL extension pad 294 is disposed over and electrically coupled to the BL landing pad 240 to reroute the BL signal. A second BLB extension pad 296 is disposed over and electrically coupled to the BLB landing pad 242 to reroute the BLB signal. The first word line 282, the second word line 284, the ground rail 280, the first BL extension pad 290, the first BLB extension pad 292, the second BL extension pad 294, and the second BLB extension pad 296 are disposed in the second metal layer (M2).

To ensure good grounding, the ground rail 280 is further electrically coupled to a first ground line 322, a second ground line 324, a third ground line 326, and the fourth ground line 328 that extend along the Y direction in the third metal layer (M3). A first BL 302 is electrically coupled to the first BL extension pad 290. A first BLB 312 is electrically coupled to the first BLB extension pad 292. A second BL 304 is electrically coupled to the second BL extension pad 294. A second BLB 314 is electrically coupled to the second BLB extension pad 296. The first BL 302, the first BLB 312, the second BL 304, and the second BLB 314 extend lengthwise along the Y direction in the third metal layer (M3).

FIG. 6 provides a metal line configuration different from what is shown in FIG. 5. As shown in FIGS. 6 and 8, the second ground line 324 and the third ground line 326 in FIG. 5 are replaced by a middle ground line 325 that is disposed over and extends along the interface between the first cell 2002 and the second cell 2004. In the dual cell 200, the configuration in FIGS. 5 and 7 includes four (4) ground lines extending along the Y direction while the configuration in FIGS. 6 and 8 includes three (3) ground lines extending along the Y direction. It is noted that, as shown in FIGS. 6 and 8, the middle ground line 325 in the third metal layer (M3) vertically overlaps the power rail 250 in the first metal layer (M1), which is electrically coupled to the positive supply voltage (CVdd).

Figure 9:
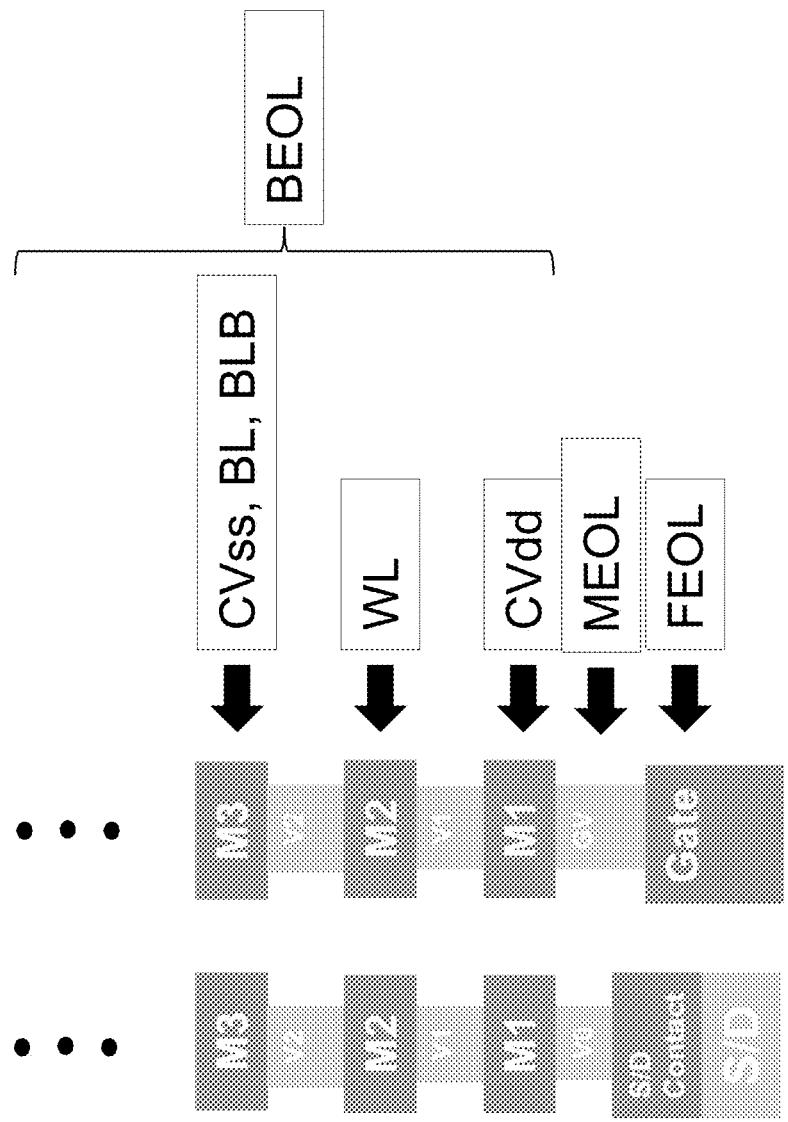
FIG. 9 is a schematic illustration of various metal lines distributed in various metal layers over an SRAM cell, according to various aspects of the present disclosure.

The vertical arrangement of the FEOL, MEOL and BEOL structures shown in FIGS. 3-7 can be summarized in FIG. 9. In embodiments of the present disclosure, the power rail 250 for the positive supply voltage (CVdd) is in the first metal layer (M1); the first word line 282 and the second word line 284 are in the second metal layer (M2); and the ground lines, BLs, and BLBs are disposed in the third metal layer (M3). It is noted that the ground rail 280 in the second metal layer (M2) does not extend over a long distance like the first ground line 322, the second ground line 324, the middle ground line 325, the third ground line 326, and the fourth ground line 328. The first metal layer (M1), the second metal layer (M2), the third metal layer (M3), and further overlying metal layers are considered BEOL structures or portions of a multi-layer interconnect (MLI) structure.

Figure 10:
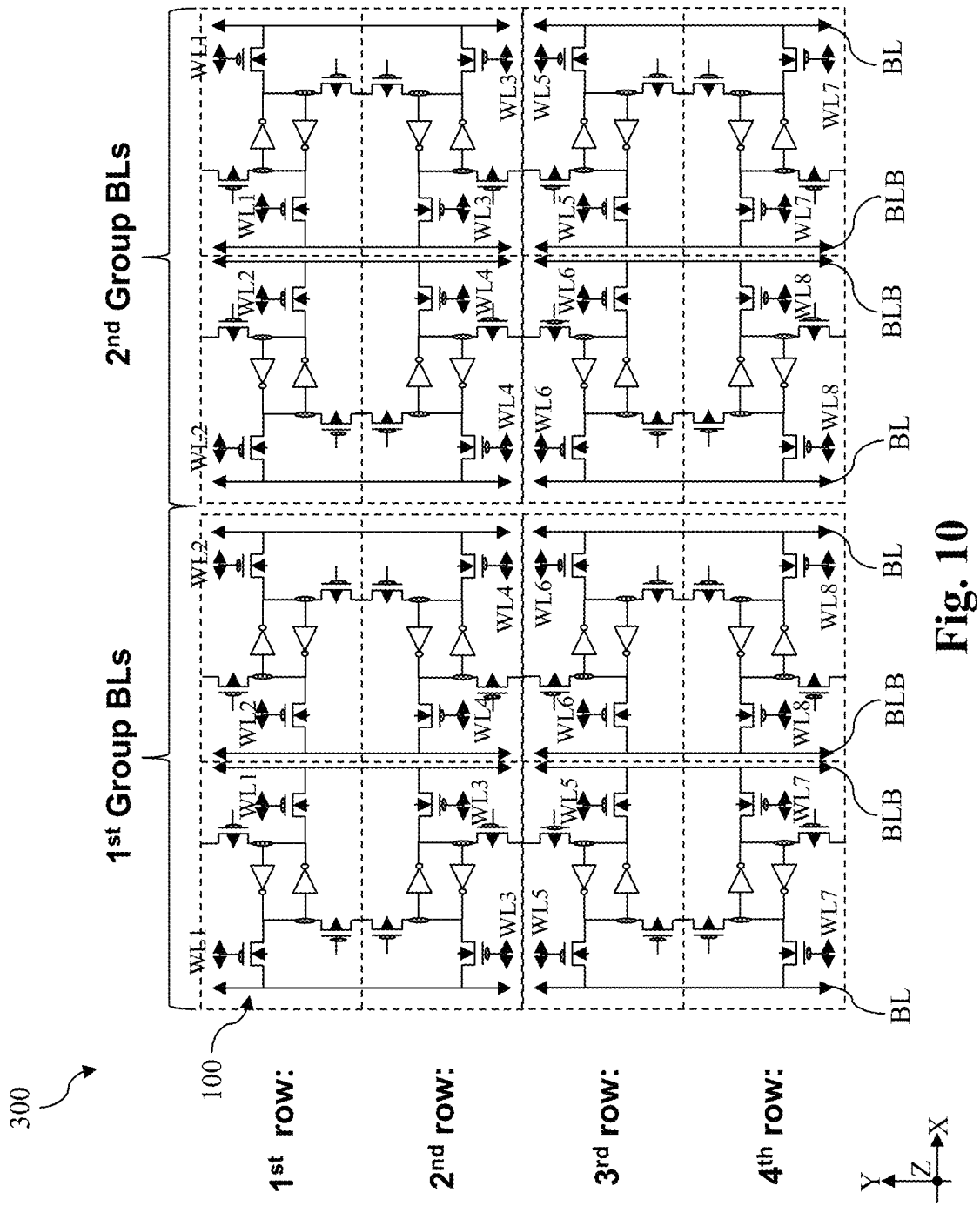
FIG. 10 is a circuit diagram depiction of an SRAM array, according to various aspects of the present disclosure.
Figure 11:
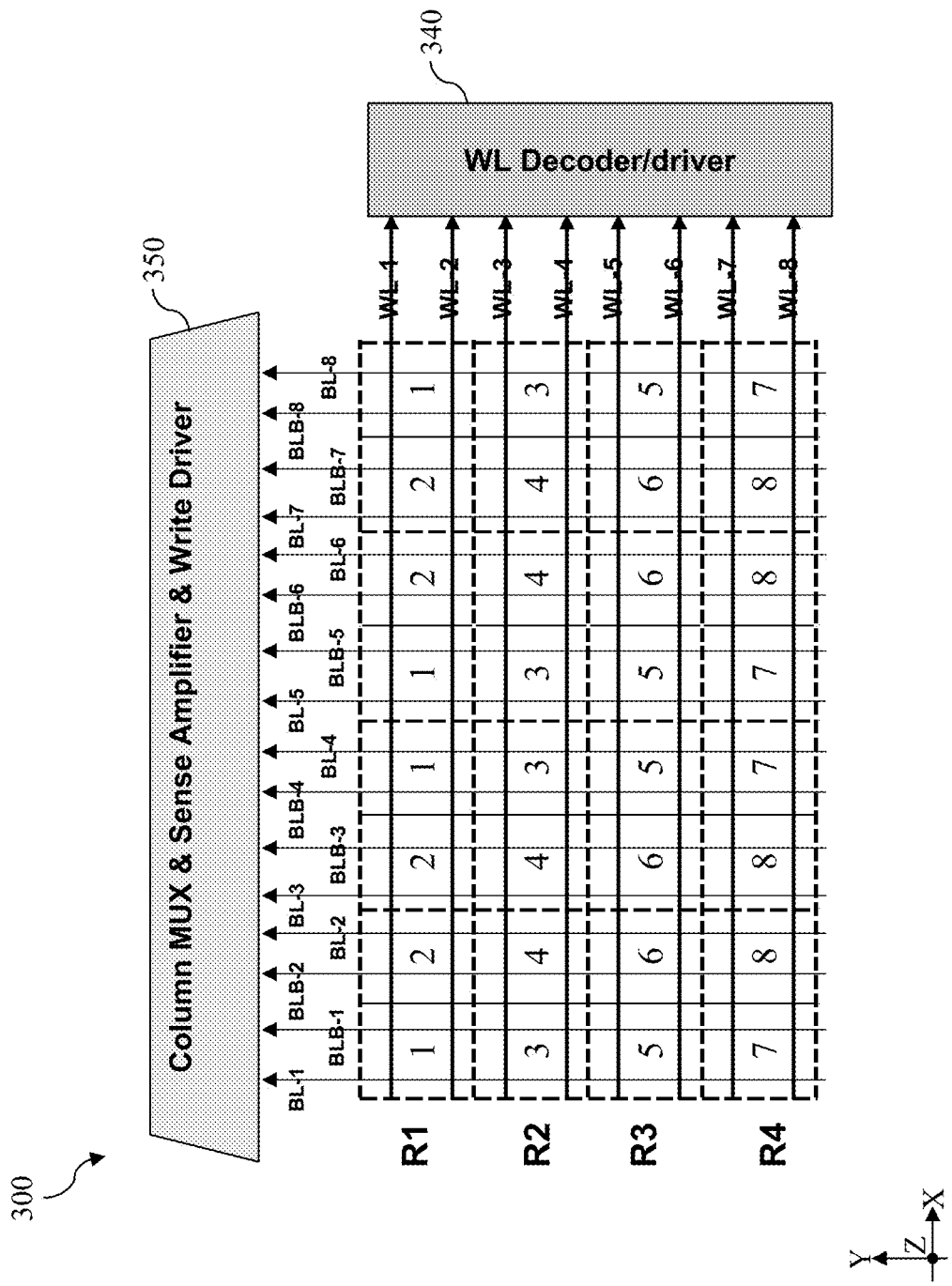
FIGS. 11 and 12 are schematic illustrations of an SRAM device including an SRAM array, according to various aspects of the present disclosure.
Figure 12:
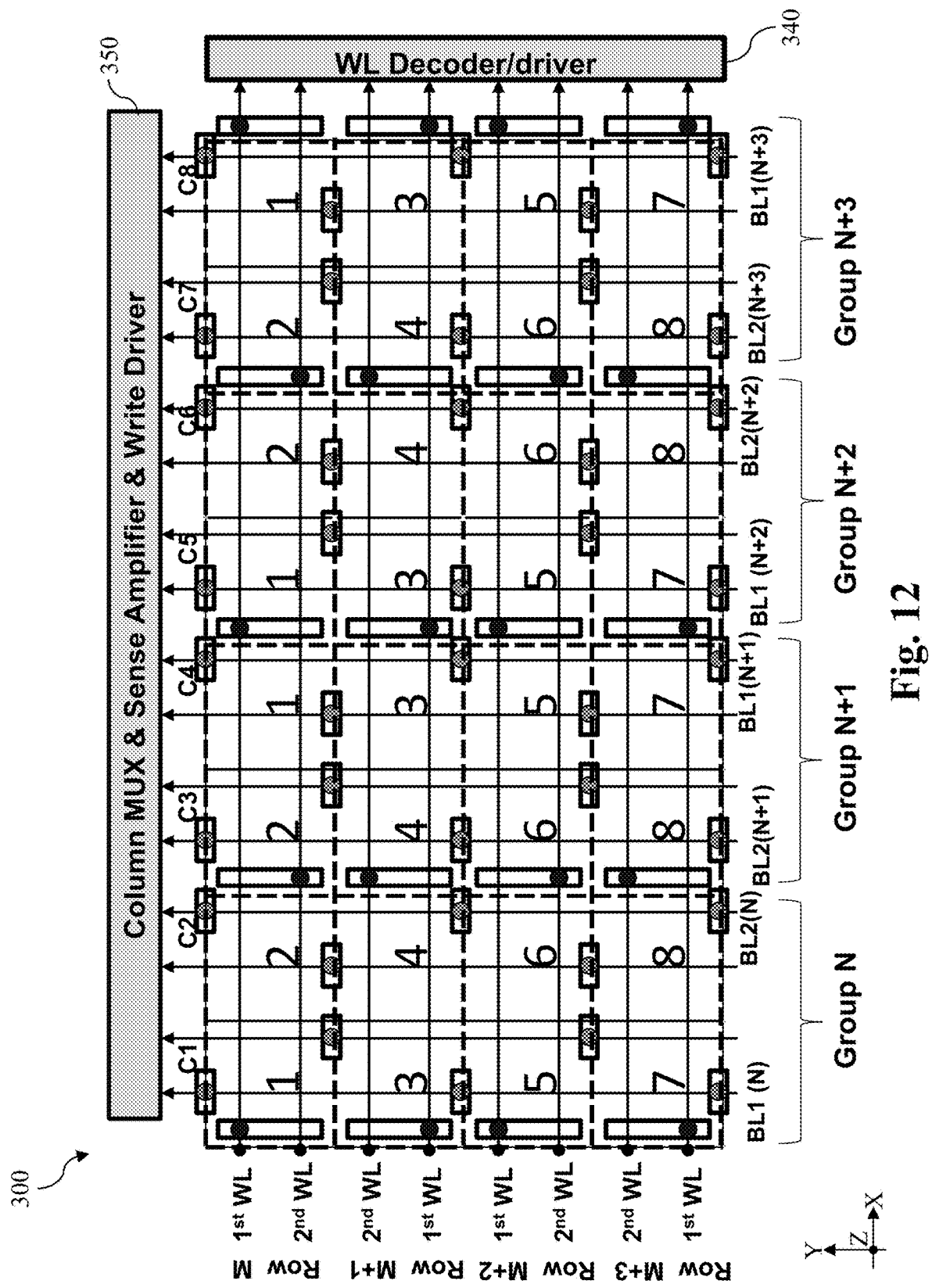

FIGS. 10, 11 and 12 illustrate circuit diagrams or schematic representation of a memory device 300 that includes the SP SRAM cell 100 or the dual cell 200 illustrated in FIGS. 2-8. FIG. 10 illustrates a memory device 300 in a circuit diagram representation. The memory device 300 in FIG. 10 includes an array of the SP SRAM cell 100 shown in FIG. 2. The array in FIG. 10 includes four (4) rows—a $1^{st}$ row, a $2^{nd}$ row, a $3^{rd}$ row, and a $4^{th}$ row. Each of the rows includes two dual cells, which include two cells that are mirror images of one another with respect to a center line extending along the Y direction. Each of the cells in a dual cell includes one pair of BL and BLB. That means, each of the dual cells includes two BLs and two BLBs that extend along the X direction. Two BLs and two BLBs are put into a group and FIG. 10 illustrates two groups of BLs—the $1^{st}$ group BLs and the $2^{nd}$ group BLs. The cells in adjacent rows are mirror images of one another with respect to a center line extending along the X direction. For example, the leftmost dual cell in the $2^{nd}$ row is a mirror image of the leftmost dual cell in the $1^{st}$ row with respect to an interface between the $1^{st}$ row and the $2^{nd}$ row. The same applies to the other rows. For instance, the leftmost dual cell in the $3^{rd}$ row is a mirror image of the leftmost dual cell in the $2^{nd}$ row. As described above, the two cells in a dual cell of the present disclosure are accessed by different word lines. With respect to the leftmost dual cell in the $1^{st}$ row, the left-hand-side 8T SRAM cell is accessed via a word line WL1 and the right-hand-side 8T SRAM cell is accessed via a word line WL2. It is noted, however, that the dual cells in one row are accessed by the same word lines. For example, the rightmost dual cell in the $1^{st}$ row also includes a left-hand-side cell and a right-hand-side cell. The former is accessed via the word line WL2 and the latter is accessed via the word line WL1. The same applies to cells in other rows.

Reference is made to FIG. 11 that illustrates a memory device 300. FIG. 11 also shows that the memory device 300 further includes a column multiplexer 350 and a word line (WL) decoder/driver 340. Like the memory device 300 in FIG. 10, the memory device 300 includes 4 rows—R1, R2, R3, and R4. The memory device 300 in FIG. 11 includes 4 dual cells in each row. Each of the 4 rows is spanned over along the X direction by two word lines. R1 is accessed by two word lines—WL1 and WL2; R2 is accessed by two word lines—WL3 and WL4; R3 is accessed by two word lines—WL5 and WL6; and R4 is accessed by two word lines WL7 and WL8. The cell labeled by a number is accessed by the word line of the same number. For example, the cells labeled "1" in R1 are accessed by WL1 and the cells labeled "2" in R1 are accessed by WL2. All of the word lines—WL1 to WL8 extend along the X direction to couple to the WL decoder/driver 340, which decodes or drive the cells. The BLs and BLBs, including BL-1 to BL-8 and BLB-1 to BLB-8, are coupled to the column multiplexer (MUX) 350. The column MUX 350 also includes or is connected to a sense amplifier to sense and amplify data stored in the cells. The column MUX 350 may also include or is coupled to a write driver to write data into the cells. The memory device 300 in FIG. 11 includes 8 columns, each being coupled to a pair of BL and BLB and 4 rows, each being accessed by two word lines. As each cell can store a bit of data, the memory device 300 in FIG. 11 is a 32-bit SRAM array. Compared to an existing memory device formed with 8T SRAM cells or 6T SRAM cells, the memory device 300 includes twice as many bit lines.

FIG. 12 illustrates a generalized memory device 300 that includes 8 rows-Row M, Row M+1, Row M+2, Row M+3 and 8 columns—C1-C8, each is accessed by a BL and a BLB. The BLs and BLBs extend along the Y direction to couple to the column MUX 350 that can also sense and write each bit line. The BLs and BLBs in each column form a group that include two outer BLs and two inner BLBs. The memory device 300 in FIG. 12 includes Group N, Group N+1, Group N+2, and Group N+3. It is noted that FIG. 12 also schematically illustrates the BL extension pads and BLB extension pads that extent lengthwise along the X direction. Each of the rows is accessed by two word lines, each of which is coupled to a land pad, which generally corresponds to the first landing pad 220 and second landing pad 222 shown in FIGS. 3 and 4. The word lines for each row are coupled to the WL decoder/driver 340.

Thus, in one aspect, the present disclosure provides a memory device. The memory device includes a first pull-down device (PD-1), a second pull-down device (PD-2), a first pass-gate device (PG-1), and a second pass-gate device (PG-2) disposed in a first p-well on a substrate and a first pull-up device (PU-1), a second pull-up device (PU-2), a first isolation device (IS-1), and a second isolation device (IS-2) disposed in an n-well adjacent the first p-well. The first pull-down device (PD-1), the second pull-down device (PD-2), the first pass-gate device (PG-1), and the second pass-gate device (PG-2) share a first active region. The first pull-up device (PU-1), the second pull-up device (PU-2), the first isolation device (IS-1), and the second isolation device (IS-2) share a second active region. A first gate of the first isolation device (IS-1) and a second gate of the second isolation device (IS-2) are coupled to a positive supply voltage. A drain of the first pull-up device (PU-1) and a drain of the second pull-up device (PU-2) are coupled to the positive supply voltage (CVdd).

In some embodiments, the first active region and the second active region extend lengthwise along a first direction and a length of the first active region along the first direction is the same as a length of the second active region along the first direction. In some implementations, the first active region includes a plurality of fins and the second active region includes a single fin. In some instances, the first active region includes a first vertical stack of nanostructures and the second active region includes a second vertical stack of nanostructures. Each of the first vertical stack of nanostructures includes a first width along a second direction perpendicular to the first direction and each of the second vertical stack of nanostructures includes a second width along the second direction. The first width is greater than the second width. In some embodiments, the memory device further includes a third pull-down device (PD-3), a fourth pull-down device (PD-4), a third pass-gate device (PG-3), and a fourth pass-gate device (PG-4) disposed in a second p-well on the substrate, and a third pull-up device (PU-3), a fourth pull-up device (PU-3), a third isolation device (IS-3), and a fourth isolation device (IS-4) disposed in the n-well. The n-well is sandwiched between the first p-well and the second p-well. The third pull-down device (PD-3), the fourth pull-down device (PD-4), the third pass-gate device (PG-3), and the fourth pass-gate device (PG-4) share a third active region. The third pull-up device (PU-3), the fourth pull-up device (PU-3), the third isolation device (IS-3), and the fourth isolation device (IS-4) share a fourth active region. A gate of the third isolation device (IS-3) and a gate of the fourth isolation device (IS-4) are coupled to the positive supply voltage (CVdd). In some instances, the first isolation device (IS-1) and the third isolation device (IS-3) share the first gate and the second isolation device (IS-2) and the fourth isolation device (IS-4) share the second gate. In some embodiments, the memory device further includes a first metal line electrically coupled to the positive supply voltage. The first gate is electrically coupled to the first metal line by way of a first via and the second gate is electrically coupled to the first metal line by way of a second via.

In another aspect, the present disclosure provides a memory structure. The memory structure may include a first cell structure and a second cell structure. The first cell structure includes a first pull-down device (PD-1), a second pull-down device (PD-2), a first pass-gate device (PG-1), and a second pass-gate device (PG-2) disposed in a first p-well on a substrate, and a first pull-up device (PU-1), a second pull-up device (PU-2), a first isolation device (IS-1), and a second isolation device (IS-2) disposed in an n-well adjacent the first p-well. The second cell structure includes a third pull-down device (PD-3), a fourth pull-down device (PD-4), a third pass-gate device (PG-3), and a fourth pass-gate device (PG-4) disposed in a second p-well such that the n-well is sandwiched between the first p-well and the second p-well, and a third pull-up device (PU-3), a fourth pull-up device (PU-4), a third isolation device (IS-3), and a fourth isolation device (IS-4) disposed in the n-well. The first isolation device (IS-1) and the third isolation device (IS-3) share a first gate. The second isolation device (IS-2) and the fourth isolation device (IS-4) share a second gate. The first gate and the second gate are electrically coupled to a positive supply voltage (CVdd).

In some embodiments, the second cell structure is a mirror image to the first cell structure with respect to a center line of the n-well. In some embodiments, the memory structure further includes a first metal line electrically coupled to the positive supply voltage (CVdd). The first gate is electrically coupled to the first metal line by way of a first via. The second gate is electrically coupled to the first metal line by way of a second via. The first metal line is disposed directly over the center line. In some embodiments, the first pull-down device (PD-1), the second pull-down device (PD-2), the first pass-gate device (PG-1), and the second pass-gate device (PG-2) share a first active region extending lengthwise along a first direction; the first pull-up device (PU-1), the second pull-up device (PU-2), the first isolation device (IS-1), and the second isolation device (IS-2) share a second active region extending lengthwise along the first direction; the third pull-up device (PU-3), the fourth pull-up device (PU-4), the third isolation device (IS-3), and the fourth isolation device (IS-4) share a third active region extending lengthwise along the first direction; and the third pull-down device (PD-3), the fourth pull-down device (PD-4), the third pass-gate device (PG-3), and the fourth pass-gate device (PG-4) share a fourth active region extending lengthwise along the first direction. In some instances, lengths of the first active region, the second active region, the third active region, and the fourth active region along the first direction are the same. In some instances, the first active region includes a first plurality of fins, the second active region includes a first single fin, the third active region includes a second single fin, and the fourth active region includes a second plurality of fins. In some embodiments, each of the first plurality of fins and the second plurality of fins includes two semiconductor fins. In some instances, the first active region includes a first vertical stack of nanostructures and the second active region includes a second vertical stack of nanostructures. Each of the first vertical stack of nanostructures includes a first width along a second direction perpendicular to the first direction and each of the second vertical stack of nanostructures includes a second width along the second direction. The first width is greater than the second width.

In still another aspect, the present disclosure provides a memory structure. The memory structure includes a first cell structure and a second cell structure. The first cell structure includes a first pull-down device (PD-1), a second pull-down device (PD-2), a first pass-gate device (PG-1), and a second pass-gate device (PG-2) sharing a first active region extending lengthwise along a first direction, and a first pull-up device (PU-1), a second pull-up device (PU-2), a first isolation device (IS-1), and a second isolation device (IS-2) sharing a second active region extending lengthwise along the first direction. The second cell structure includes a third pull-down device (PD-3), a fourth pull-down device (PD-4), a third pass-gate device (PG-3), and a fourth pass-gate device (PG-4) sharing a third active region extending lengthwise along the first direction, and a third pull-up device (PU-3), a fourth pull-up device (PU-4), a third isolation device (IS-3), and a fourth isolation device (IS-4) sharing a fourth active region extending lengthwise along the first direction. Lengths of the first active region, the second active region, the third active region, and the fourth active region along the first direction are the same.

In some embodiments, the memory structure further includes a first metal line and a second metal line extending along the first direction, and a first word line and a second word line extending over the first metal line and the second metal line along a second direction perpendicular to the first direction. A gate of the first pass-gate device (PG-1) and a gate of the second pass-gate device (PG-2) are electrically coupled to the first metal line. A gate of the third pass-gate device (PG-3) and a gate of the fourth pass-gate device (PG-4) are electrically coupled to the second metal line. A first word line is electrically coupled to the first metal line and insulated from the second metal line. The second word line is electrically coupled to the second metal line and insulated from the first metal line. In some implementations, the first isolation device (IS-1) and the third isolation device (IS-3) share a first gate. The second isolation device (IS-2) and the fourth isolation device (IS-4) share a second gate. The first gate and the second gate are electrically coupled to a positive supply voltage (CVdd). In some instances, the memory structure further includes a metal line electrically coupled to the positive supply voltage (CVdd). The first gate is electrically coupled to the metal line by way of a first via. The second gate is electrically coupled to the metal line by way of a second via. The first metal line is disposed directly over a boundary between the first cell structure and the second cell structure. In some embodiments, each of the first cell structure and the second cell structure includes a length along the first direction and a width along a second direction perpendicular to the first direction and a ratio of the width to the length is between about 0.5 and about 1.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
   a first pull-down device (PD-1), a second pull-down device (PD-2), a first pass-gate device (PG-1), and a second pass-gate device (PG-2) disposed in a first p-well on a substrate;
   a first pull-up device (PU-1), a second pull-up device (PU-2), a first isolation device (IS-1), and a second isolation device (IS-2) disposed in an n-well adjacent the first p-well; and
   a metal line extending over the n-well,
   wherein the first pull-down device (PD-1), the second pull-down device (PD-2), the first pass-gate device (PG-1), and the second pass-gate device (PG-2) share a first active region,
   wherein the first pull-up device (PU-1), the second pull-up device (PU-2), the first isolation device (IS-1), and the second isolation device (IS-2) share a second active region,
   wherein the metal line continuously spans over and is electrically coupled to a first gate of the first isolation device (IS-1) and a second gate of the second isolation device (IS-2),
   wherein the metal line is coupled to a positive supply voltage,
   wherein a drain of the first pull-up device (PU-1) and a drain of the second pull-up device (PU-2) are coupled to the positive supply voltage (CVdd).

2. The memory device of claim 1,
   wherein the first active region and the second active region extend lengthwise along a first direction,
   wherein a length of the first active region along the first direction is the same as a length of the second active region along the first direction.

3. The memory device of claim 2,
   wherein the first active region comprises a plurality of fins,
   wherein the second active region comprises a single fin.

4. The memory device of claim 2,
   wherein the first active region comprises a first vertical stack of nanostructures,
   wherein the second active region comprises a second vertical stack of nanostructures,
   wherein each of the first vertical stack of nanostructures comprises a first width along a second direction perpendicular to the first direction,
   wherein each of the second vertical stack of nanostructures comprises a second width along the second direction,
   wherein the first width is greater than the second width.

5. The memory device of claim 1, further comprising:
   a third pull-down device (PD-3), a fourth pull-down device (PD-4), a third pass-gate device (PG-3), and a fourth pass-gate device (PG-4) disposed in a second p-well on the substrate, the n-well being sandwiched between the first p-well and the second p-well; and a third pull-up device (PU-3), a fourth pull-up device (PU-3), a third isolation device (IS-3), and a fourth isolation device (IS-4) disposed in the n-well, wherein the third pull-down device (PD-3), the fourth pull-down device (PD-4), the third pass-gate device (PG-3), and the fourth pass-gate device (PG-4) share a third active region, wherein the third pull-up device (PU-3), the fourth pull-up device (PU-3), the third isolation device (IS-3), and the fourth isolation device (IS-4) share a fourth active region, where a gate of the third isolation device (IS-3) and a gate of the fourth isolation device (IS-4) are coupled to the positive supply voltage (CVdd).

6. The memory device of claim 5,
wherein the first isolation device (IS-1) and the third isolation device (IS-3) share the first gate,
wherein the second isolation device (IS-2) and the fourth isolation device (IS-4) share the second gate.

7. The memory device of claim 6,
wherein the first gate is electrically coupled to the metal line by way of a first via,
wherein the second gate is electrically coupled to the metal line by way of a second via.

8. A memory structure, comprising:
a first cell structure comprising:
a first pull-down device (PD-1), a second pull-down device (PD-2), a first pass-gate device (PG-1), and a second pass-gate device (PG-2) disposed in a first p-well on a substrate, and
a first pull-up device (PU-1), a second pull-up device (PU-2), a first isolation device (IS-1), and a second isolation device (IS-2) disposed in an n-well adjacent the first p-well; and
a second cell structure comprising:
a third pull-down device (PD-3), a fourth pull-down device (PD-4), a third pass-gate device (PG-3), and a fourth pass-gate device (PG-4) disposed in a second p-well such that the n-well is sandwiched between the first p-well and the second p-well, and
a third pull-up device (PU-3), a fourth pull-up device (PU-4), a third isolation device (IS-3), and a fourth isolation device (IS-4) disposed in the n-well,
wherein the first isolation device (IS-1) and the third isolation device (IS-3) share a first gate,
wherein the second isolation device (IS-2) and the fourth isolation device (IS-4) share a second gate,
wherein the first gate and the second gate are electrically coupled to a positive supply voltage (CVdd).

9. The memory structure of claim 8, wherein the second cell structure is a mirror image to the first cell structure with respect to a center line of the n-well.

10. The memory structure of claim 9, further comprising:
a first metal line electrically coupled to the positive supply voltage (CVdd),
wherein the first gate is electrically coupled to the first metal line by way of a first via,
wherein the second gate is electrically coupled to the first metal line by way of a second via,
wherein the first metal line is disposed directly over the center line.

11. The memory structure of claim 8,
wherein the first pull-down device (PD-1), the second pull-down device (PD-2), the first pass-gate device (PG-1), and the second pass-gate device (PG-2) share a first active region extending lengthwise along a first direction, wherein the first pull-up device (PU-1), the second pull-up device (PU-2), the first isolation device (IS-1), and the second isolation device (IS-2) share a second active region extending lengthwise along the first direction,
wherein the third pull-up device (PU-3), the fourth pull-up device (PU-4), the third isolation device (IS-3), and the fourth isolation device (IS-4) share a third active region extending lengthwise along the first direction,
wherein the third pull-down device (PD-3), the fourth pull-down device (PD-4), the third pass-gate device (PG-3), and the fourth pass-gate device (PG-4) share a fourth active region extending lengthwise along the first direction.

12. The memory structure of claim 11, wherein lengths of the first active region, the second active region, the third active region, and the fourth active region along the first direction are the same.

13. The memory structure of claim 12,
wherein the first active region comprises a first plurality of fins,
wherein the second active region comprises a first single fin,
wherein the third active region comprises a second single fin,
wherein the fourth active region comprises a second plurality of fins.

14. The memory structure of claim 13, wherein each of the first plurality of fins and the second plurality of fins comprises two semiconductor fins.

15. The memory structure of claim 11,
wherein the first active region comprises a first vertical stack of nanostructures,
wherein the second active region comprises a second vertical stack of nanostructures,
wherein each of the first vertical stack of nanostructures comprises a first width along a second direction perpendicular to the first direction,
wherein each of the second vertical stack of nanostructures comprises a second width along the second direction,
wherein the first width is greater than the second width.

16. A memory structure, comprising:
a first cell structure comprising:
a first pull-down device (PD-1), a second pull-down device (PD-2), a first pass-gate device (PG-1), and a second pass-gate device (PG-2) sharing a first active region extending lengthwise along a first direction, and
a first pull-up device (PU-1), a second pull-up device (PU-2), a first isolation device (IS-1), and a second isolation device (IS-2) sharing a second active region extending lengthwise along the first direction; and
a second cell structure comprising:
a third pull-down device (PD-3), a fourth pull-down device (PD-4), a third pass-gate device (PG-3), and a fourth pass-gate device (PG-4) sharing a third active region extending lengthwise along the first direction, and
a third pull-up device (PU-3), a fourth pull-up device (PU-4), a third isolation device (IS-3), and a fourth isolation device (IS-4) sharing a fourth active region extending lengthwise along the first direction,
wherein lengths of the first active region, the second active region, the third active region, and the fourth active region along the first direction are the same,
wherein the first isolation device (IS-1) and the third isolation device (IS-3) share a first gate, wherein the second isolation device (IS-2) and the fourth isolation device (IS-4) share a second gate.

17. The memory structure of claim 16, further comprising:
   a first metal line and a second metal line extending along the first direction; and
   a first word line and a second word line extending over the first metal line and the second metal line along a second direction perpendicular to the first direction,
   wherein a gate of the first pass-gate device (PG-1) and a gate of the second pass-gate device (PG-2) are electrically coupled to the first metal line,
   wherein a gate of the third pass-gate device (PG-3) and a gate of the fourth pass-gate device (PG-4) are electrically coupled to the second metal line,
   wherein the first word line is electrically coupled to the first metal line and insulated from the second metal line,
   wherein the second word line is electrically coupled to the second metal line and insulated from the first metal line.

18. The memory structure of claim 16,
   wherein the first gate and the second gate are electrically coupled to a positive supply voltage (CVdd).

19. The memory structure of claim 18, further comprising:
   a metal line electrically coupled to the positive supply voltage (CVdd),
   wherein the first gate is electrically coupled to the metal line by way of a first via,
   wherein the second gate is electrically coupled to the metal line by way of a second via,
   wherein the first metal line is disposed directly over a boundary between the first cell structure and the second cell structure.

20. The memory structure of claim 16,
   wherein each of the first cell structure and the second cell structure comprises a length along the first direction and a width along a second direction perpendicular to the first direction,
   wherein a ratio of the width to the length is between about 0.5 and about 1.

* * * * *